(12) United States Patent
Cheek

(10) Patent No.: US 10,393,815 B2
(45) Date of Patent: Aug. 27, 2019

(54) VOICE COUNTING OF EACH BATTERY UNDER TEST

(71) Applicant: Fluke Precision Measurement Ltd., Norwich (GB)

(72) Inventor: Steven L. Cheek, Shanghai (CN)

(73) Assignee: Fluke Precision Measurement Ltd., Norwich (GB)

( * ) Notice: Subject to any disclaimer, the term of this patent is extended or adjusted under 35 U.S.C. 154(b) by 330 days.

(21) Appl. No.: 14/614,307

(22) Filed: Feb. 4, 2015

(65) Prior Publication Data

US 2015/0241522 A1    Aug. 27, 2015

(30) Foreign Application Priority Data

Feb. 21, 2014   (CN) .......................... 2014 1 0060094

(51) Int. Cl.
*H02J 7/00*      (2006.01)
*H02J 7/14*      (2006.01)
(Continued)

(52) U.S. Cl.
CPC ......... *G01R 31/371* (2019.01); *G01R 31/385* (2019.01)

(58) Field of Classification Search
USPC ....... 324/425, 426, 427, 428, 429, 430, 431, 324/432, 433, 434; 320/132, 136, 107,
(Continued)

(56) References Cited

U.S. PATENT DOCUMENTS 4,685,065 A   8/1987   Braun et al.
5,047,961 A   9/1991   Simonsen
(Continued)

FOREIGN PATENT DOCUMENTS

CN   2189747 Y   2/1995
CN   2800288 Y   7/2006
(Continued)

OTHER PUBLICATIONS

European Search Report dated Jul. 20, 2015 for corresponding EP Application No. 15155086.0-1562, 8 pages.
(Continued)

*Primary Examiner* — Alexis B Pacheco
(74) *Attorney, Agent, or Firm* — Seed Intellectual Property Law Group LLP

(57) ABSTRACT

A method and apparatus for testing batteries uses an audible voice prompt 35, 64 to enunciate the battery label or identifier that will be stored with the battery measurement in memory. Since the battery test technician must pay careful attention to the placement of the probes onto the battery terminal, the use of a voice prompt, rather than a visual prompt, allows the technician to keep his/her eyes on the test probes. If the label enunciated by the voice prompt does not match the label of the battery under test, the label on the tester can be reset to match the battery under test. In particular, a battery tester has a program which displays sequential numbers of battery labels that are stored with each battery's measurement data in memory. The sequence of labels corresponds to the sequential numbers marked on batteries in a string, array or matrix.

20 Claims, 4 Drawing Sheets

(51) Int. Cl.
*G01R 31/371* (2019.01)
*G01R 31/385* (2019.01)

(58) Field of Classification Search
USPC .................. 320/112, 135, 105, 134, 162
See application file for complete search history.

(56) References Cited

U.S. PATENT DOCUMENTS

| | | | |
|---|---|---|---|
| 5,444,768 A | 8/1995 | Lemaire et al. | |
| 5,528,660 A | 6/1996 | Heins et al. | |
| 5,694,019 A | 12/1997 | Uchida et al. | |
| 6,384,591 B1 | 5/2002 | Estep et al. | |
| 7,027,568 B1* | 4/2006 | Simpson | H04M 3/4938 379/67.1 |
| 7,304,618 B2 | 12/2007 | Plathe | |
| 8,544,753 B2 | 10/2013 | Antebi et al. | |
| 2003/0001578 A1* | 1/2003 | Lam | H01H 13/70 324/426 |
| 2004/0160410 A1* | 8/2004 | Plathe | G01R 1/04 345/156 |
| 2004/0251907 A1 | 12/2004 | Kalley | |
| 2005/0162172 A1* | 7/2005 | Bertness | G01R 31/3627 324/426 |
| 2005/0218902 A1* | 10/2005 | Restaino | G01R 19/16542 324/433 |
| 2006/0136544 A1 | 6/2006 | Atsmon et al. | |
| 2006/0284619 A1 | 12/2006 | Quint et al. | |
| 2007/0001680 A1* | 1/2007 | Khoo | G01R 31/3655 324/430 |
| 2009/0125179 A1 | 5/2009 | Miller et al. | |
| 2009/0179763 A1* | 7/2009 | Sheng | G01R 31/3627 340/636.1 |
| 2009/0251149 A1* | 10/2009 | Buckner | G01R 1/0408 324/426 |
| 2013/0257414 A1 | 10/2013 | Cs et al. | |
| 2013/0293995 A1* | 11/2013 | Brown | G01R 31/3631 361/93.1 |
| 2014/0070813 A1* | 3/2014 | Luo | G01R 31/3627 324/426 |
| 2015/0046109 A1* | 2/2015 | Miwa | G01R 31/3679 702/63 |
| 2015/0198670 A1* | 7/2015 | Thiel | G01R 31/362 324/426 |

FOREIGN PATENT DOCUMENTS

| | | |
|---|---|---|
| CN | 101498743 A | 8/2009 |
| CN | 102236081 A | 11/2011 |
| CN | 202929052 U | 5/2013 |
| EP | 2 081 039 A2 | 7/2009 |
| TW | 200933180 A | 8/2009 |

OTHER PUBLICATIONS

Chinese Office Action dated Sep. 14, 2018 for Chinese application No. 201410060094.1, 21 pages. (With English Translation).

* cited by examiner

VOICE COUNTING OF EACH BATTERY UNDER TEST

BACKGROUND

Batteries are essential elements of many electronic devices, systems, and networks. Banks of batteries often supply backup power for telephone networks and computer networks including and not limited to clusters of computer servers for web hosting and cloud computing. Banks of batteries also are found in solar power and wind power networks. In those networks, the battery banks store energy during times of peak production to supply electrical power when the sun is not shining or the wind is calm. As data centers proliferate and as solar and wind power grow, it is important to monitor batteries that backup servers and store energy.

Batteries are an important component to the uninterruptable power supply (UPS) for a network of computers or computer servers. The UPS has a mains power input that is converted to direct current by a rectifier in order to charge the batteries in the bank. At the UPS output, an inverter converts the direct current into alternating current to supply power to the network.

Each battery in the bank is an electrochemical apparatus with a finite life. Individual batteries require inspection, maintenance, repair, and replacement. Typical measurements include temperature, voltage, current, internal resistance, impedance, conductance, battery condition, and the date and time of the measurements. Temperature extremes, alternating ripple voltage and current reduce battery life. Batteries may be kept in rooms with controlled temperatures, but it is important to monitor the amount of AC ripple on a battery. As batteries age, their internal resistance increases and that also reduces their life. Other measured parameters include DC and AC voltage and current.

Batteries in a bank are typically numbered sequentially. A first battery in a string, array, or matrix of batteries may be labeled number "1" and subsequent batteries increase the number by one for each battery. A battery tester has internal memory. The battery tester's memory holds both the test results and the label that identifies each battery.

As the technician or engineer uses the battery tester to sequentially test each battery, the tester successively increments the value of the label and records both the label and the test results for each battery in memory. The battery tester increments the value of the label for each successive battery so that the label correlates the test results (and time-stamp) with the label of each battery. For example, after battery number "1" is tested and its results are stored in memory with the label "1," the tester increments the label to labeled memory location "2" and is ready to store the tests results for battery number "2."

During a typical test, a first technician holds an instrument, such as a multimeter or battery tester, that performs and records test measurements. The battery tester has a pair of conductors extending from its body and terminates in a pair of probes. A second technician manipulates the probes to contact terminals of the battery. Since a battery may be installed in a position that makes probing difficult, extender arms may be attached to the probes to enable the technician to reach the battery.

When testing a large number of batteries, it is difficult to correctly associate the stored test results to the battery that generates the results. Since there may be hundreds of batteries and hundreds of test readings, the correct test reading must be correlated to the correct battery. Because testing is repetitious and fatiguing, mis-probing is common and often there are more readings recorded than there are actual batteries, indicating that one or more batteries have been tested twice. When such errors occur, it is time consuming to find a specific battery that may have failed a test or is beginning to show signs of failure.

One approach to making sure stored readings correlate to the correct battery is to show the number of the battery under test on the display of the battery tester. However, viewing the display is often very difficult as the technician must pay strict attention to the position of the test probes in the high-energy environment of the battery bank. To mitigate this problem, often a second technician follows the first technician to keep track of the numbering and to hold the battery tester. This allows the first technician to devote his or her full attention to correctly placing the probes on the battery terminals. Nevertheless, even when two technicians conduct the testing, mistakes in matching the test results with the batteries in the bank are still common.

SUMMARY

Rather than relying only on the visual observation of the display to show the label or identifier of the battery under test, the new method and apparatus stores the test results in memory and an audible voice speaks the battery label or identifier that will be stored with the battery measurement in memory. The storing of the test results can be either automated or occur with operation of a button on the tester. In this way, when the audible voice says, for example, "three," the technician knows that he or she should have just tested battery number 3. At the storing of the next test result, the audible voice will increment to, for example, "four." As a result, it is easier to stay on track and avoid costly re-testing of batteries. In addition, the testing can be completed with one technician instead of two.

Embodiments of the invention overcome the drawbacks of the prior art and provide a more reliable method and apparatus for recording battery test data. Rather than relying on a visual indicator alone, as each battery is tested an audible voice speaks the label number or identifier on the display that should be the same as the label or identifier of the battery under test. Then, both the label and data associated with the label are stored in memory. The voice prompt is produced by a speaker. In one embodiment, the speaker is built into the body of the tester. In another embodiment the speaker is built into the body of one of the probes. In a further embodiment the speaker is a headphone or ear bud that is wirelessly coupled to the tester to receive a transmission from the test that contains the voice prompt.

The technician operating the test probes confirms that the number announced by the voice prompt corresponds to the number on the battery to which the probes are connected. If not, the battery tester is reset to display the correct number that corresponds to the battery under test and the test is repeated. When the number given by the voice prompt corresponds to the battery number connected to the probes, the technician advances the tester to the next sequentially labeled memory location for storing test results for the next sequential battery number.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
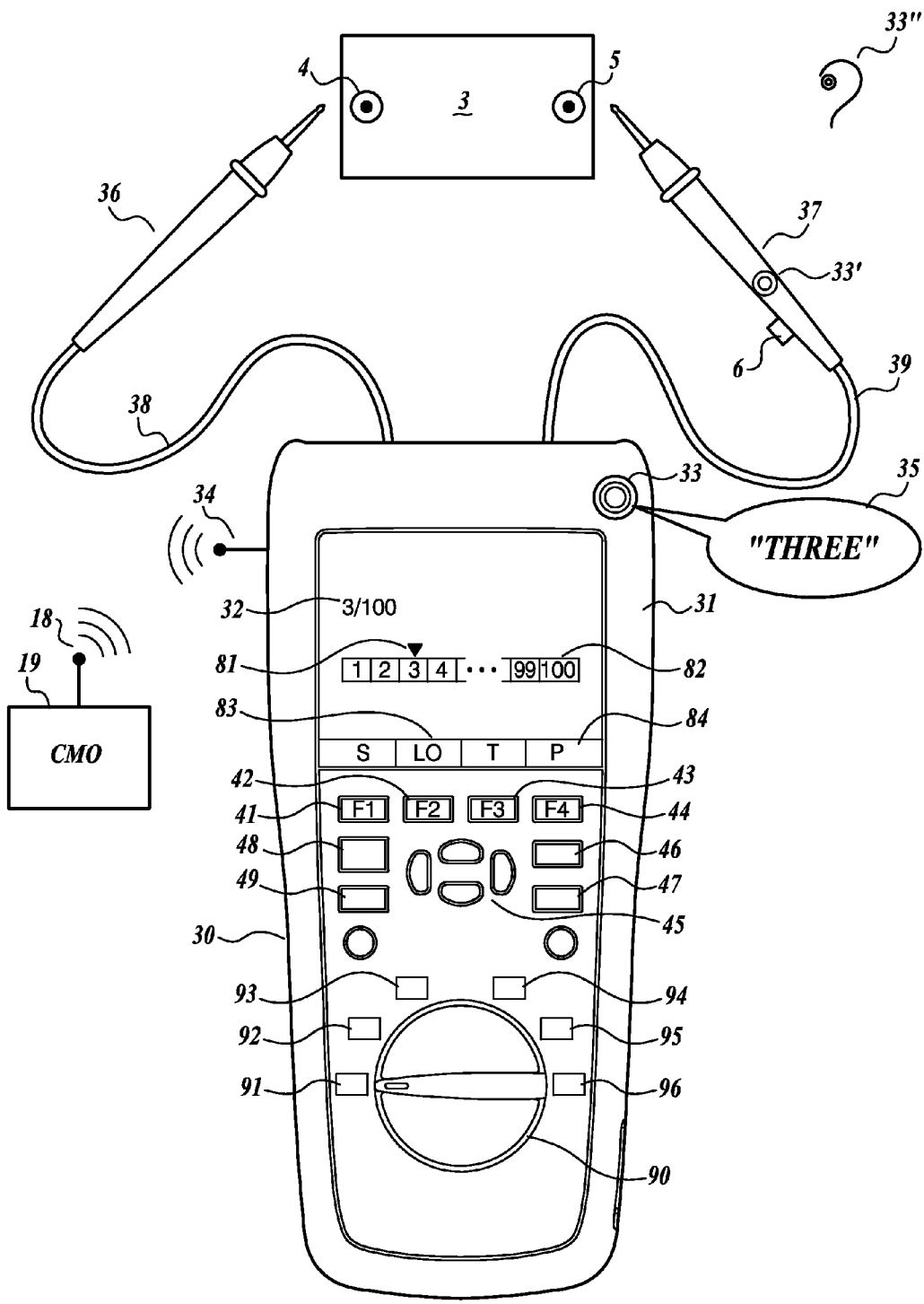
FIG. 1 is a plan view of a battery tester, a battery under test and a remote central operation office.

Turning to FIG. 1, a battery tester 30, battery number 3 with terminals 4, 5 and a central monitoring operation 19 are shown. The battery tester 30 has a body with a top panel 31 with a display 32, speaker 33, antenna 34, a selection knob 90 with positions 91-96, scroll pad 45 with four-directional scroll keys, and other functional keys or buttons 41-44 and 46-49, respectively. The display 32 shows a string of boxes numbered 1-100. While the antenna is shown on the outside of the tester, those skilled in the art understand that the antenna may be inside the body of the tester. The number of each box identifies the battery label. The measurement data associated with this battery is stored in memory with that label. The numbers in the boxes correspond to batteries that are numbered in the same sequence. As such, measurement data for location 3/100 (meaning box 3 of a string of one hundred boxes) is selected for storing battery test data for battery number 3. The arrowhead 81 above box 3 indicates that stored test results will have a label numbered '3'. The arrowhead 81 may be moved left or right using the scroll keys of the scroll pad 45.

Functional keys 41-44 are above the scroll pad 45 and are assigned one or more operating functions. Key 41 is a save key and will save data shown on display 32 to the memory location for storing test data of the battery number identified in a memory string 82 where each memory location is represented by a numbered box. Key 42 selects a low pass filter to remove high-frequency noise. Key 43 provides a threshold function that allows the user to establish measurement threshold values that, if exceeded, will notify the user. Key 44 provides a profile function that allows the user to store characteristics of a battery string, e.g., the number of batteries and the starting number label or identifier for that string of batteries. In an autotest mode, each battery will have its impedance reading recorded when the impedance sensed by the probes reaches a steady value. Operating buttons 46-49 are assigned one or more operations and flank the scroll pad 45.

A pair of lead wires 38, 39 extend from the body of the tester 30 and terminate in extended probe arms 36, 37, respectively. The extended probe arms may be between 0.5 feet to two feet in length. When batteries are difficult to access, the longer probes allow the technician to easily reach the battery number 3. A test button switch 6 on probe arm 37 is adapted to operate the battery tester 30 to perform one or more tests on battery number 3.

Selector knob 90 may be set to one or more positions 91-96. In position 91, the tester 30 will measure internal battery resistance or impedance with resolution in milliohms. Position 92 enables measuring discharge volts. This function allows sequential measurement of the battery string as it is being discharged. Positions 93, 94, and 95 enable measuring DC voltage, AC voltage, and ripple, respectively.

Position 96 enables the display to show a memory string 82 of boxes where each box is one of a number sequence of boxes and each box corresponds to a memory of a battery having the same sequence number as the box in string 81. Scroll pad 45 has keys to position an arrowhead 81 above on the boxes to access data in the labeled memory location corresponding to the number of the box.

In one embodiment, a speaker 33 is located on the top panel 31 of the tester. In alternate embodiments, a speaker 33' is located on probe 37 and further embodiments provide an ear bud 33" that a technician places in his ear to receive a wireless signal that carries the voice prompt from the transceiver 52 to the ear bud 33". Those skilled in the art understand that other embodiments may have a speaker located elsewhere so long as it is within the hearing range of the technician probing the battery and the voice prompt may be sent via wired and wireless communications to the speaker.

In some embodiments of the invention, the battery tester 30 communicates with a central monitoring operation (CMO) 19 via wireless communication. The battery tester has a transceiver 53 (see also FIG. 2) which sends and receives wireless communications through antenna 34. The CMO 19 also has a transceiver 16 to send and receive wireless communications via antenna 18. Other technicians in the CMO 19 may receive test results from the battery tester 30 and send messages or control information to the battery tester 30.

Figure 2:
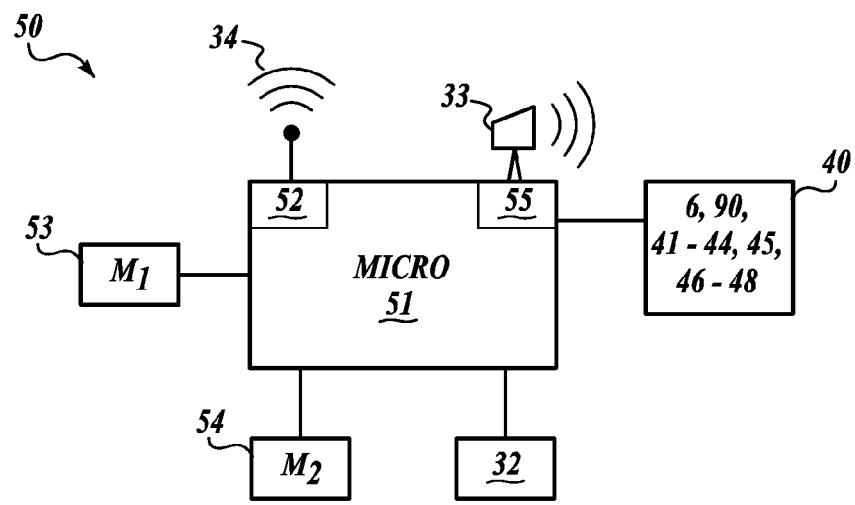
FIG. 2 is a schematic view of the electronic components of the battery tester.

Referring to FIG. 2, the battery tester 30 has an electronic system 50 including a processor 51, a wireless transceiver 52, and input members 40 including a test switch 6 on lead 37, the selector knob 90, the functional keys 41-44 and the buttons 46-49 and scroll keys 45. The transceiver 52 may send and receive messages and data to or from other locations, including the CMO 19 and to a remote speaker 33". The processor 51 is coupled to one or more memories 53, 54 and serves as an operational, control and computational center of the battery tester 30 by supporting the execution of program instructions stored in those memories. The memories 53, 54 store the test data of the batteries in memory locations labeled to the battery numbers. The memories 53, 54 are in the form of volatile or nonvolatile memory, such as read only memory ("ROM"), random access memory ("RAM"), EEPROM, flash memory, or other memory technology.

Module 55 is a voice generator module which converts data corresponding to numbers, words and alpha-numeric characters into a voice prompt having the phonemes corresponding to the data. Such modules can employ text-to-speech technology and include hardware, software, or combinations thereof. One of ordinary skill in the art is familiar with such hardware and software. See, for example, U.S. Pat. Nos. 5,444,768; 7,027,568; and 8,544,753, all of which are hereby incorporated by reference. Those of ordinary skill in the art and others will recognize memories 53, 54 store data and/or program modules that are immediately accessible to and/or currently being operated on by the processor 51. Generally, program modules may include routines, applications, objects, components, data structures, etc., that perform particular tasks or implement particular abstract data types. It will be appreciated that memories described herein are merely examples of various computer-readable storage media and they may be any volatile or nonvolatile, removable or non-removable memory, implemented using any technology capable of storing information.

Figure 3:
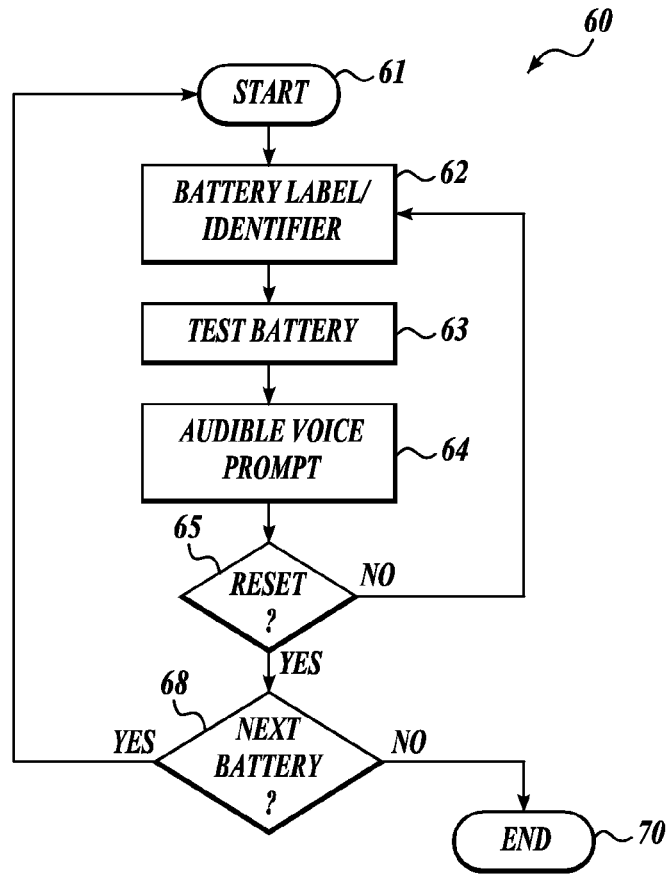
FIG. 3 is a diagram of a testing process for the battery tester.

Referring to FIG. 3, there is shown a high level flow chart that includes operating steps of a method 60 for testing a bank of batteries. The method may be a combination of automatic and/or manual steps undertaken by the electronic system 50 based upon hardware, software, or combinations thereof and inputs from a technician operating the battery tester 30. A technician operates the selection knob 90 to set the battery tester 30 to auto test mode and to position 96 to access and display the memory string 82 on the display 32. The processor 51 controls the auto test mode to sequentially test one battery, automatically store the test results in the labeled memory location for the battery, and advance the tester to the next sequential labeled location for storing test results for the next battery.

With the tester in auto test mode, the tester records each battery test in the numbered order of the batteries and stores the test results in a labeled memory location with the same sequential number as the battery under test along with the date and time of the test. In one embodiment, the test results are automatically stored in the labeled memory location represented by the sequential number of the battery and the audible voice prompt announces the location where the test results were stored. That number should correspond to the number on the battery contacted by the probes. In an alternate embodiment, the audible prompt may announce the next battery and labeled memory location for testing.

As mentioned above, a single technician may conduct a test of a bank of batteries. The tester 30 is equipped with a harness to hang the tester in front of the technician so he or she can look down and see the display 32 (step 62). The technician places the probes 36, 37 on the terminals 4, 5 of the battery 3. The test may occur automatically after the tester 30 determines the voltage has stabilized to a value within a predetermined tolerance. As an alternative, the technician may press button 6 to conduct a measurement or test of the battery (step 63), including, for example, DC voltage or internal resistance. Results may also be shown on a small, remote display that attaches to the hand of the technician such as shown and described in U.S. Pat. No. 7,304,618, whose entire contents are hereby incorporated by reference. Results of the measurement or test will appear on the display and will be stored in the labeled memory location ("3") below arrowhead 81. If, however, the voice prompt (step 64) from the speaker 33 does not correspond to battery "3", the technician resets (step 65) the tester to position the arrowhead 81 above the labeled memory location "3" and retakes the measurements or tests. If that voice prompt is identical to the label on the battery that was tested, the technician moves to the next battery in the sequence (step 68), battery "4," and tests that battery. In step 64, the voice generator module 55 produces a voice prompt that corresponds to the labeled memory location where the results were stored. The remaining batteries are tested in their sequential, numbered order (step 68) until there are no further batteries to test, whereupon the testing ends, step 70.

It is a feature of an embodiment of the battery tester 30 to announce information that the user may interpret to determine whether the test results for the battery under test were correctly stored in a labeled memory location having the same sequential number as the battery under test. The batteries in an array, matrix, or string may be tested sequentially in an order corresponding to the numerical sequence of the batteries and/or their locations. For example, assume batteries are tested in numerical order and the technicians have finished testing the battery 3. After the results are stored, the speaker 33 on the tester 30 will audibly announce "three" so that the technician probing the battery can confirm that the probes were on the correct battery before moving to battery number 4. As an alternative, the voice generator 55 may produce an audible prompt of the next battery to test or a combination thereof, such as "three completed, move to battery four." If the voice prompt announces the stored location of the battery just tested or the number of the next battery to be tested, the user has enough information to determine whether the information for the battery just tested was correct.

Figure 4A:
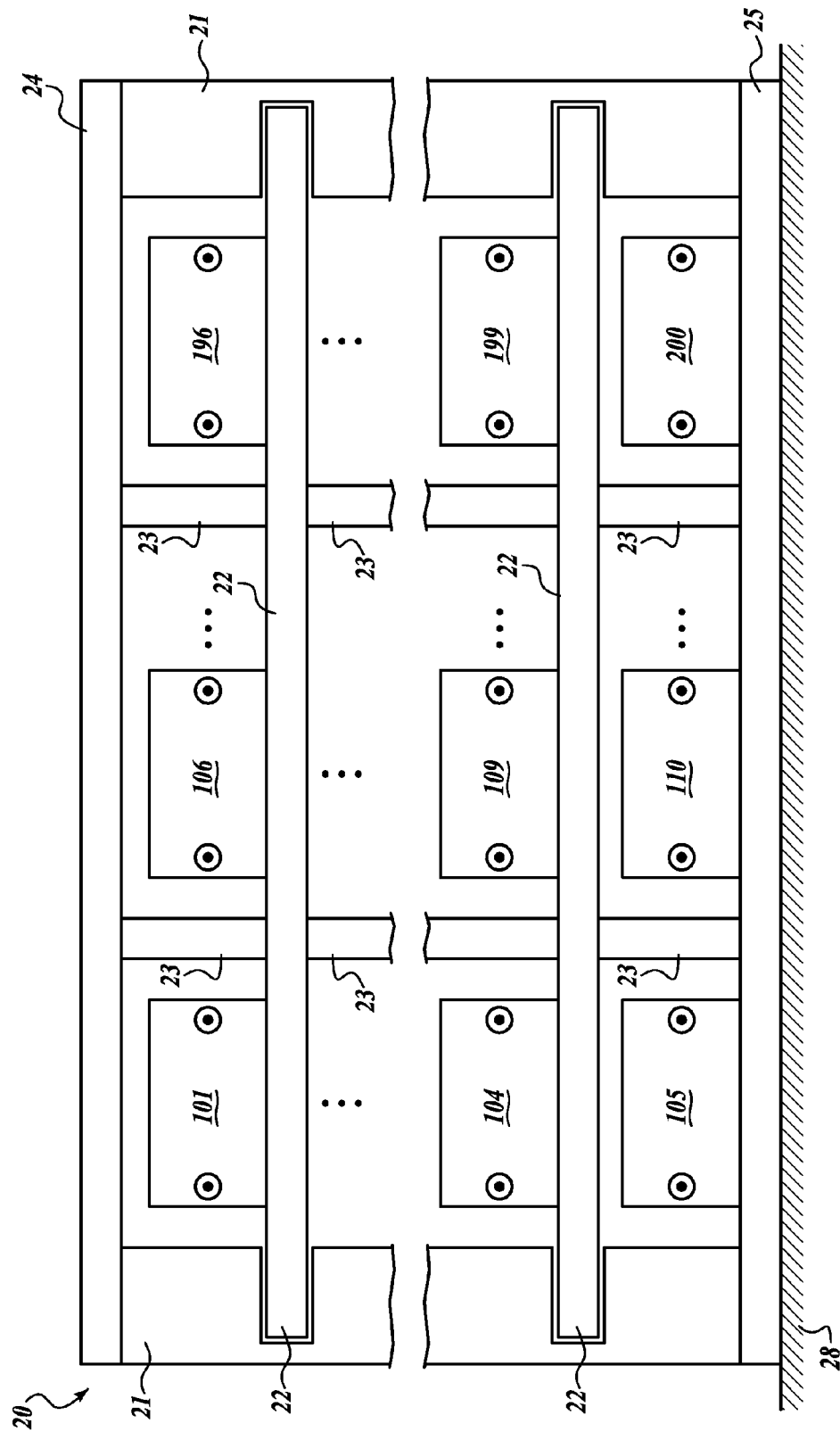
FIG. 4A is a first schematic elevation view of a matrix of batteries supported by a frame.

FIG. 4A shows a matrix of batteries. The batteries are supported in a frame 20 that rests on a floor 28. The batteries are sequentially marked with numbers beginning with battery number 101 in the top left hand corner and ending with battery 200 in the lower right hand corner. Each battery in the frame 20 rests on a shelf 22. The shelves 22 are supported by vertical end support members 21 and intermediate support members 23 that extend between opposite shelves. Top and bottom cross members 24, 25 connect to the end members 21. The components of frame 20 may be made in a number of materials including wood, steel, aluminum, plastic, or other material adapted to support the weight of the matrix of batteries.

Figure 4B:
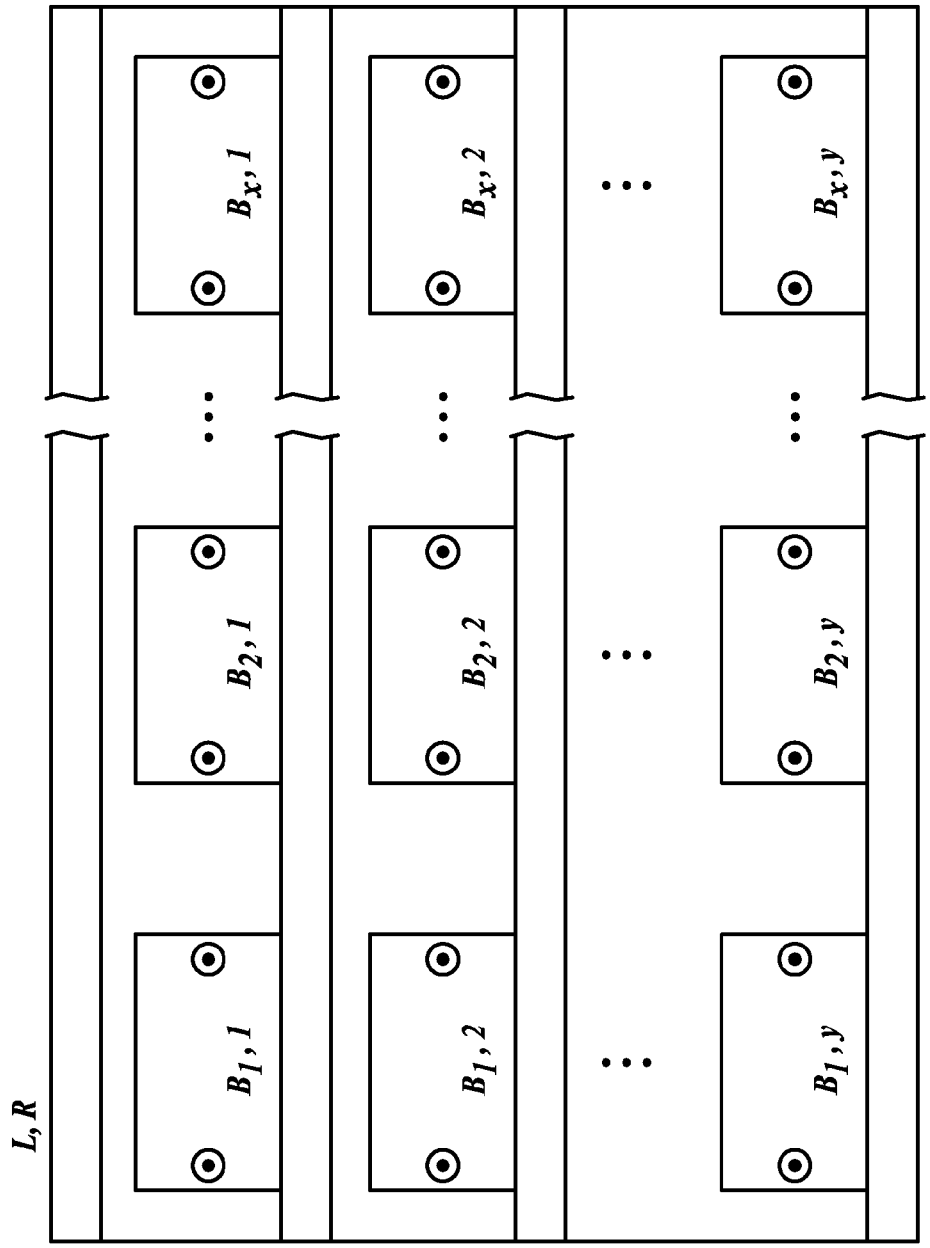
FIG. 4B is a second schematic elevation view of a matrix of batteries supported by a frame.

Turning to FIG. 4B, there is an alternate embodiment of matrix of batteries. The frame (not shown) is the same as the frame 20 of FIG. 4A. Each battery bears an alpha-numeric name including a letter followed by a two-digit number where the first digit indicates the row and the second digit indicates the column where the battery is found. For example, the battery in the top left hand corner is marked $B_1,1$, the battery in the top right hand corner is marked $B_x,1$, the battery in the lower left hand corner is marked $B_1,y$, and the battery in the lower right hand corner is marked $B_{xy}$. Accordingly, the name of the battery corresponds to its coordinate (x, y) location in the matrix. Although it is not required that the name of the battery corresponds to its location, such an arrangement has the advantage of assisting the maintenance technician in identifying the battery under test.

Other identification systems are possible. One could also mark the batteries with random words, random numbers, random letters, or combinations thereof, so long as whichever markings are used, the memory locations are identified by corresponding identical random words, numbers, random letters, or combinations thereof. Other embodiments include arrays or matrices of batteries where each battery is identified by, marked with, or assigned a set of one or more unique phonemes and the corresponding memory locations have the same set of unique phonemes.

In the embodiments, the voice prompt includes phonemes that correspond to the phonemes used to mark the batteries. In languages that use alphabetical characters and numbers, the image on the display comprises the same alphabetical characters and numbers that are marked on the batteries. Other languages, such as Chinese and Japanese, employ writings that are pictographs or ideographs. In such cases, the image on the display may include images of the pictographs or ideographs that correspond to the memory locations and the voice prompt will correspond to the spoken expression associated with the ideograph or pictograph.

While preferred embodiments of the invention have been shown and described, modifications and variations may be made thereto by those of ordinary skill in the art without departing from the spirit and scope of the present invention. In addition, it should be understood that aspects of the various embodiments may be interchanged either in whole or in part. Furthermore, those of ordinary skill in the art will appreciate that the foregoing description is by way of example only, and is not intended to limit the invention, except as further described in the appended claims. Those skilled in the art will understand that other and equivalent components and steps may be used to achieve substantially the same results in substantially the same way as described and claimed.

The embodiments of the invention in which an exclusive property or privilege is claimed are defined as follows:

1. A method for testing a plurality of batteries, comprising:
    electrically connecting probes of an instrument to terminals of a battery under test, wherein said battery under test is one of a plurality of batteries to be tested, and wherein each battery of the plurality of batteries to be tested is associated with an image representative of a unique phoneme of a set of unique phonemes;
    providing a corresponding number of labeled memory locations in a computer memory for holding test results, wherein each labeled memory location is labeled with an image corresponding to one of the images associated with the batteries;
    displaying on a display of the instrument a graphical representation of a labeled memory location, wherein the displayed graphical representation corresponds to the battery under test;
    by the instrument, testing the battery under test and recording test results in the labeled memory location shown on the display; and
    automatically electronically generating, by a voice generator module operating in the instrument, an audible voice prompt that provides information interpretable by a user of the instrument to confirm whether the test results for the battery under test were correctly recorded in the labeled memory location corresponding to the battery under test.

2. The method of claim 1, wherein the audible voice prompt expresses phonemes representative of the labeled memory location on the display where the test results were stored for the battery under test.

3. The method of claim 1, wherein the audible voice prompt expresses the unique phoneme associated with the next battery to be tested.

4. The method of claim 1, wherein the set of unique phonemes is a sequence of numbers.

5. The method of claim 1, wherein the instrument has a controller in communication with the computer memory for holding the test results, wherein the controller stores the test results in the labeled memory location corresponding to the unique phoneme of the battery under test.

6. The method of claim 1, wherein the phonemes are one or more of the group consisting of letters, words, numbers, and combinations thereof.

7. The method of claim 1, further comprising resetting the labeled memory location corresponding to the battery under test and retesting the battery if the audible voice prompt of the labeled memory location indicates a phoneme that is different from the unique phoneme corresponding to the battery under test.

8. A method for testing a bank of batteries, comprising:
    electrically connecting a test instrument to a battery under test in a bank of batteries to be tested, wherein each battery in the bank of batteries to be tested is associated with a sequential number from a set of sequential numbers;
    providing a corresponding number of labeled memory locations in a computer memory for holding test results, wherein each labeled memory location is labeled with a sequential number corresponding to the sequential number of a battery in the bank of batteries;
    displaying on a display of the test instrument a graphical representation of a labeled memory location, wherein the displayed graphical representation corresponds to the battery under test and includes the sequential number of the battery under test;
    by the instrument, testing the battery under test and recording test results in the labeled memory location shown on the display; and
    automatically electronically generating, by the test instrument, an audible voice prompt that provides information interpretable by a user of the test instrument to confirm whether the test results for the battery under test were correctly recorded in the labeled memory location corresponding to the battery under test.

9. The method of claim 8, wherein the audible voice prompt expresses the sequential number of the labeled memory location on the display where the test results were stored for the battery under test.

10. The method of claim 8, wherein the audible voice prompt expresses a next sequential number for a next sequential battery to be tested.

11. The method of claim 8, wherein the instrument has a controller in communication with the computer memory for holding the test results, wherein the controller stores the test results in the labeled memory location corresponding to the sequential number of the battery under test.

12. The method of claim 8, further comprising resetting the labeled memory location corresponding to the battery under test and retesting the battery if the audible voice prompt of the labeled memory location expresses a sequential number that is different from the sequential number corresponding to the battery under test.

13. An instrument for testing batteries, comprising:
    a processor configured to control one or more tests that are performed by the instrument on batteries;
    a memory coupled to the processor, said memory having a plurality of labeled memory locations, wherein each memory location corresponds to a battery identified by a unique phoneme, and wherein the processor is configured to record test results from a test performed on a battery under test in a memory location corresponding to the battery under test;
    a display that shows an image corresponding to the phoneme of the battery under test;
    a voice generator module that electronically generates a signal representative of an audible voice prompt that audibly identifies the labeled memory location shown on the display corresponding to the battery under test where the test results of the battery under test were stored; and
    a speaker coupled to the voice generator module, wherein in response to the signal generated by the voice generator module, the speaker generates said audible voice prompt.

14. The instrument of claim 13, wherein the phonemes that identify the batteries are a sequence of numbers.

15. The instrument of claim 13, wherein the memory locations are identified by characters corresponding to said phonemes, and wherein the processor is configured to store the test results in the memory location corresponding to the unique phoneme of the battery under test.

16. The instrument of claim 13, wherein the phonemes that identify the batteries are one or more of the group consisting of letters, words, numbers, and combinations thereof.

17. The instrument of claim 15, wherein the processor is adapted to reset the memory location and retest the battery under test if the audible voice prompt expresses a phoneme that is different from the phoneme of the battery under test corresponding to the image shown on the display of the instrument.

18. The instrument of claim 13, wherein the speaker is mounted on a body of the instrument.

19. The instrument of claim 13, wherein the speaker is mounted on a probe coupled to the instrument.

20. The instrument of claim 13, wherein the speaker is mounted on a headset or an ear bud.

* * * * *